(12) United States Patent
Agarwal

(10) Patent No.: US 7,659,749 B2
(45) Date of Patent: Feb. 9, 2010

(54) PULSED DYNAMIC LOGIC ENVIRONMENT METRIC MEASUREMENT CIRCUIT

(75) Inventor: Kanak B. Agarwal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 11/876,100

(22) Filed: Oct. 22, 2007

(65) Prior Publication Data
US 2009/0102508 A1    Apr. 23, 2009

(51) Int. Cl.
    *H03K 19/00*    (2006.01)
(52) U.S. Cl. .............................. 326/93; 326/46; 714/724
(58) Field of Classification Search .................. 326/37, 326/38, 46, 93–98; 714/724–729
See application file for complete search history.

(56) References Cited

U.S. PATENT DOCUMENTS

2003/0145265 A1\*   7/2003   Siegel ......................... 714/726
2008/0022173 A1\*   1/2008   Chua-Eoan et al. ......... 714/726
2009/0116312 A1\*   5/2009   Carpenter et al. ........... 365/194

OTHER PUBLICATIONS

U.S. Appl. No. 11/750,475, filed May 18, 2007, Singh.

Chen, et al., "A Time-to-Digital-Converter-Based CMOS Smart Temperature Sensor", IEEE, JSSC, vol. 40, No. 8, Aug. 2005.
Dudek, et al., "A High Resolution CMOS Time-to-Digital Converter Utilizing a Vernier-Based Delay Line", IEEE Trans. on Solid-State Circuits, vol. 35, No. 2, Feb. 2000.
Restle, et al., "Timing Uncertainty Measurements on the Power5 Microprocessor", 2004 IEEE ISSC Conference, Jun. 2004.

\* cited by examiner

*Primary Examiner*—Don P Le
(74) *Attorney, Agent, or Firm*—Mitch Harris, Atty at Law, LLC; Andrew M. Harris; Libby Z. Handelsman

(57) ABSTRACT

A pulsed dynamic logic environment metric measurement circuit provides self-referenced, low area/cost and low power measurement of circuit environment metrics, such as supply voltage. A cascade of dynamic logic stages is clocked with a pulse having a width substantially independent of an environment metric to which the delay of the dynamic logic stages is sensitive. The number of dynamic logic stages that evaluate within a given pulse provides a direct measure of the pulse width, and thus the value of the circuit metric. The pulse may be generated from a logical exclusive-OR combination of a clock signal provided from two circuit paths that differ in sensitivity to the environment metric to be measured. One circuit path may have a delay substantially determined only by wire delay, which is not substantially sensitive to circuit environment metrics such as power supply voltage.

24 Claims, 7 Drawing Sheets

PULSED DYNAMIC LOGIC ENVIRONMENT METRIC MEASUREMENT CIRCUIT

BACKGROUND OF THE INVENTION

1. Field of the Invention

The present invention is related to measurement circuits for measuring metrics such as circuit environment variables, and more particularly to a dynamic logic metric measurement circuit.

2. Description of Related Art

Environmental measurement circuits are finding application in integrated circuits such as processor cores, in which it is useful to evaluate and/or monitor variation in circuit environment metrics such as temperature and supply voltage. Such variations can lead to substantial changes in circuit performance and may vary rapidly. Therefore, it is desirable to make real-time measurements without increasing power consumption significantly, and without requiring large circuit area.

Existing delay-based measurement circuits typically employ a chain of static logic inverters in a delay line or ring-oscillator arrangement. The delay of the delay line is sensitive to one or more environment metrics and either the delay of the delay line or the frequency of the ring oscillator is measured to determine the value of the environment metric(s). However, frequency measurement places a limitation on the real-time (cycle-by-cycle) availability of the measurement data, as the frequency must be measured long enough to attain a desired resolution, and a typical static inverter chain delay measurement must be decoded to determine the length of the delay. Control logic and calibration/reference circuits are also typically needed in present environmental monitors so that the delay can be strongly correlated to the environmental metric that is being measured.

Therefore, it would be desirable to provide a metric measurement circuit requiring low power, small circuit area and does not require additional circuitry to decode the output. It would further be desirable to provide a metric measurement circuit that is self-referenced with respect to variations of non-measured circuit metrics.

SUMMARY OF THE INVENTION

The above objectives of providing a measurement circuit having small circuit area and low power requirements that does not require additional decode circuitry and is self-referenced is provided in a method and apparatus. The method is a method of operation of the apparatus.

The apparatus is a dynamic logic circuit that comprises a series of cascaded dynamic logic stages. The dynamic logic stages are clocked by a pulse having a width dependent on an environmental metric to be measured. The number of dynamic logic stages that evaluate during the pulse provides a direct measure of the pulse width. Non-inverting outputs of the dynamic logic stages are used to provide the cascade connection to the input of the next dynamic logic stages, so that a change of state in the output bit pattern directly indicates the duration of the pulse, and thus the value of the environmental metric.

The pulse that clocks the cascaded dynamic logic stages may be generated from an ordinary clock signal, such as that provided from an oscillator, using an exclusive-OR operation that yields a pulse having a width dependent on the delay between two circuit paths. One circuit path may be predominately wire delay and the other path predominately logic delay, so that the pulse width is referenced to the wire delay, which does not vary substantially with circuit metrics such as power supply voltage.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

The present invention relates to circuits and methods for measuring circuit metrics such as supply voltage variation within an integrated circuit. The circuits are made very compact by the use of dynamic logic stages that evaluate in response to a pulse that is applied to the clock (evaluate input) to multiple cascaded dynamic logic stages that have a delay dependent upon the circuit metric, e.g., supply voltage, to be measured. A pulse generating circuit generates a pulse having a constant width. The last dynamic logic stage to evaluate (and the first dynamic logic state not to evaluate) thereby indicate the width of the pulse with respect to the delay of the dynamic logic stages. The input to the first dynamic logic stages is generally hard-wired to cause the dynamic logic stages to evaluate, and the last dynamic logic stage to evaluate (and the first dynamic logic state not to evaluate) thereby indicates the delay of the dynamic logic stages as the "evaluate" value proceeds through the cascade. The circuits are simple and compact enough for distribution across a die, so that variation of supply voltage, and any other circuit metric the delay of the dynamic logic stages can be sensitized to (e.g., temperature), can be measured. The present invention provides a more compact design than prior art delay-based circuit metric measurement circuits by using dynamic logic and by reducing the amount of output decoding required to interpret the delay result. For example, if a threshold delay level is to be determined, the output circuit that determines whether the circuit metric is above or below a threshold value need only observe the output of a single dynamic logic stage to determine whether or not the delay amount, and therefore the circuit metric, is greater than a predetermined value.

Figure 1:
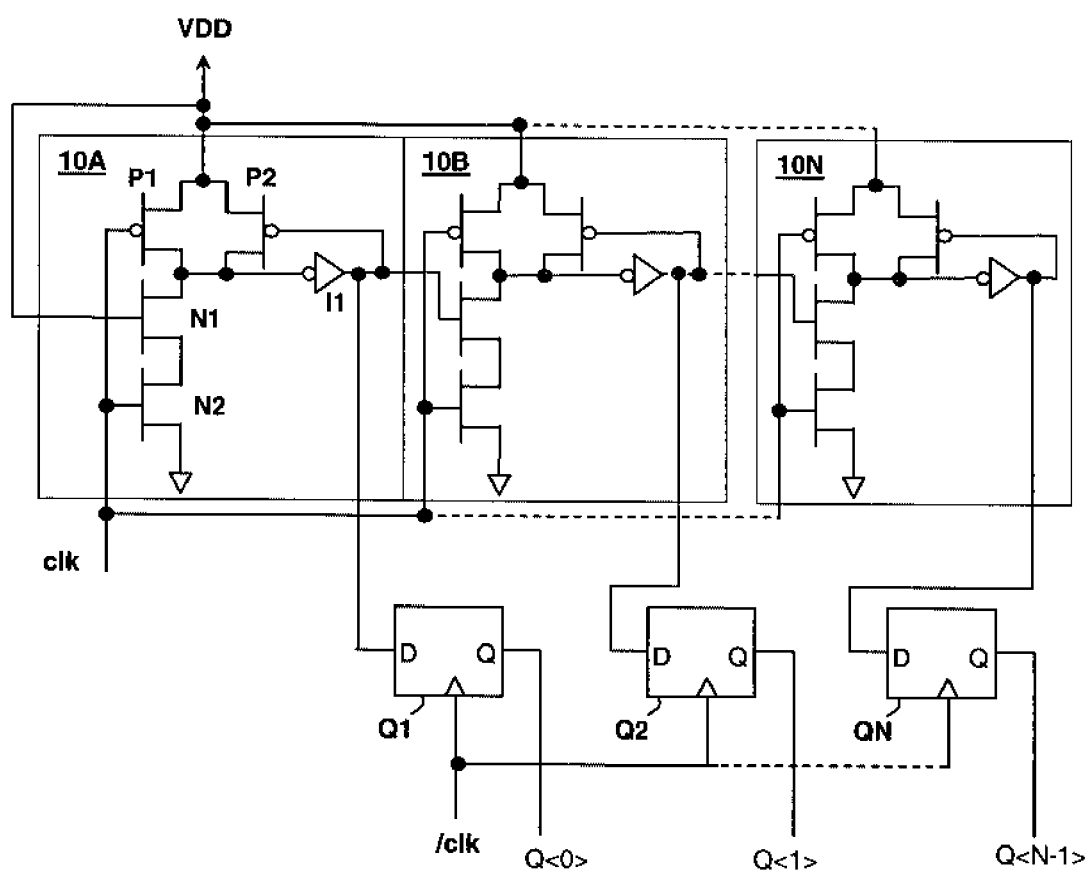
FIG. 1 is a schematic diagram depicting a measurement circuit according to an embodiment of the present invention.

Referring now to FIG. 1, a measurement circuit in accordance with an embodiment of the present invention is shown. A plurality of dynamic logic stages 10A-10N are connected in cascaded, with first dynamic logic stage 10A hard-wired so that first dynamic logic stage 10A will evaluate when a clock signal clk is asserted. Clock signal clk enables a foot device N2 and the logic input provided at the gate of transistor N1 is hard-wired to supply voltage VDD. Transistor P1 pre-charges the evaluation node of dynamic logic stage 10A prior to the assertion of clock signal clk. Transistor P2 is a keeper device controlled by the output of an inverter I1, which provides the output of dynamic logic stage 10A and has an input connected to the evaluation node of dynamic logic stage 10A. Transistor P2 ensures that the evaluation node stays in a non-evaluated state until transistor N1 is activated and may be omitted for the first stage of the circuit of FIG. 1, but is provide so that all dynamic logic stages are identical in the embodiment depicted and thus have identical evaluation delays.

When clock signal clk is asserted, all of dynamic logic stages 10A-10N leave the pre-charge phase and will evaluate in sequence as the output of the previous state provides an input that will cause each of dynamic logic stages 10A-10N to evaluate in succession. Latches Q1-QN capture the state of the outputs of dynamic logic stages 10A-10N when clock signal clk is de-asserted (i.e., when inverted clock signal /clk is asserted at the clock input to latches Q1-QN). The value at the outputs of latches Q1-QN when clock signal clk is de-asserted is therefore a string of binary values of the form <00 . . . 0001 . . . 111> where the transition point from logical "0" to logical "1" indicates the length of the delay of dynamic logic stages 10A-10N with respect to the active half-period of clock signal clk. Dynamic logic gates are generally delay-sensitive to power supply voltage, as the series combination of transistors N1 and N2 can be considered as a resistor discharging the capacitance of the evaluation node (plus conducting any leakage current contributed by the keeper circuit). However, the design of the dynamic logic gates can be sensitized to other circuit metrics such as temperature, i.e., by providing a constant current source for discharging the evaluation node and using an inverter I1 having a threshold voltage sensitized to temperature, etc.

Figure 2A:
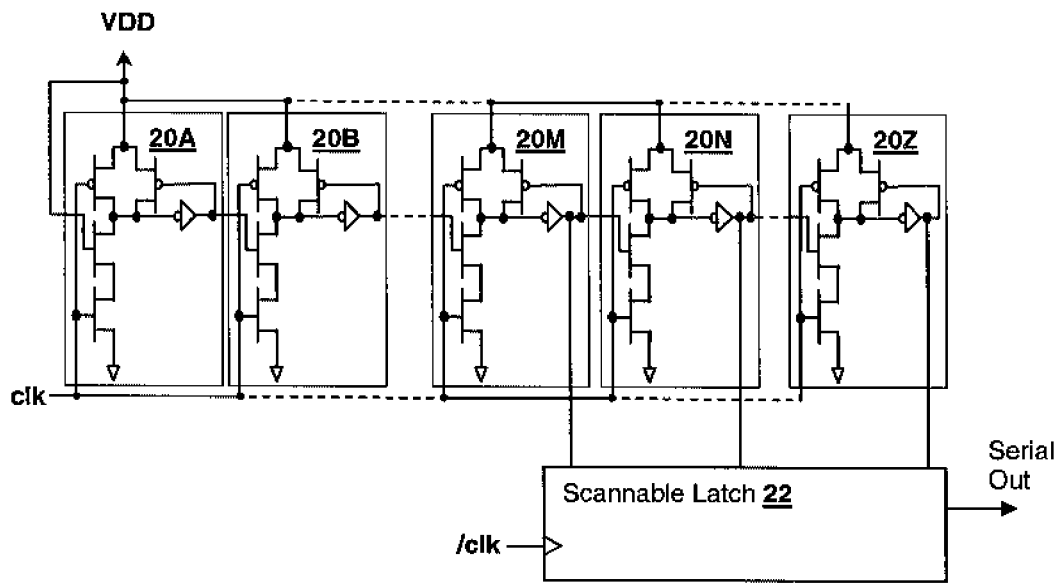
FIG. 2A is a schematic diagram depicting a measurement circuit according to another embodiment of the present invention.

Referring now to FIG. 2A, a measurement circuit in accordance with another embodiment of the invention is shown. In the circuit of FIG. 2A, a number of dynamic logic stages, e.g., dynamic logic stages 20A-20B, in the first portion of the cascade are not connected to output latches, and provide for a baseline (minimum) delay value prior to dynamic logic stages 20M-20Z, which are connected to an output latch 22, which is illustrated as a scannable latch. Output values from all measurement circuits shown herein may be made by scannable latches within a die, a register that may be programmatically or otherwise accessed in a serial or parallel fashion, or another suitable digital interface. Further, as mentioned above, for some applications only a single latch may be used to provide an output value that indicates whether or not the delay is above/below a threshold delay value. Finally, if a separate pre-charge and evaluate clock are provided to the dynamic logic stages, one or more outputs of the dynamic logic cascade may be used directly to provide the delay indication if the pre-charge clock is disabled until the delay measurement results have been stored or processed.

Figure 2B:
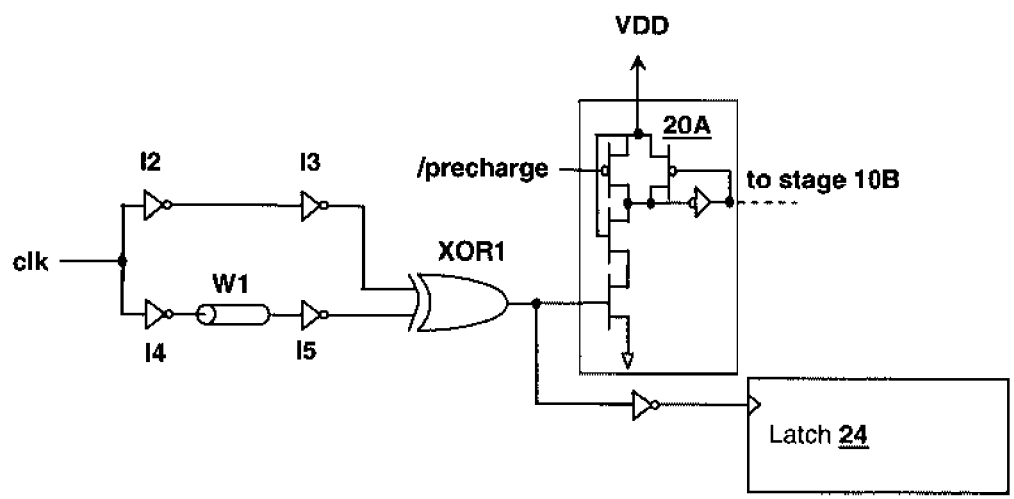
FIG. 2B is a schematic diagram depicting a pulse generating circuit according to an embodiment of the present invention.

Referring now to FIG. 2B, a pulse generating circuit that may be used in measurement circuits according to the present invention is shown, according to an embodiment of the invention. In the depicted embodiment, a clock edge is provided by signal clk and is compared by logical exclusive-OR gate XOR1 after passing through two separate delay paths. Alternatively, any edge may be used to generate the pulse in the circuit of FIG. 2B, such as an output of a register that is set to initiate the measurement. The first delay path is a logic-only delay path, provided by inverters I2 and I3. The second delay path is provided by inverters I3 and I4 in combination with a wire length W1, having a wire delay that is unaffected by the supply voltage of the logic. The output of logical exclusive-OR gate XOR1 is a pulse having a width equal to the wire delay of wire length W1, and the pulse is provided as an evaluate input to a first dynamic logic circuit 20A of a multiple stage delay such as the circuit of FIG. 2A. Dynamic logic circuit 20A is supplied with a /precharge signal prior to measurement of the pulse width, which may be provided by clock signal clk as in the above-described circuits of FIG. 1 and FIG. 2A. Since the pulse width provided to the evaluate input of first dynamic logic circuit 20A is substantially constant with respect to power supply voltage, the number of stages in the cascade of dynamic logic stages that evaluate is determined only from the delay of the dynamic logic stages themselves. The output of logical exclusive-OR gate XOR1 can also be used to provide the latching clock to a latch 24, as shown provided through inverter I6.

Figure 3:
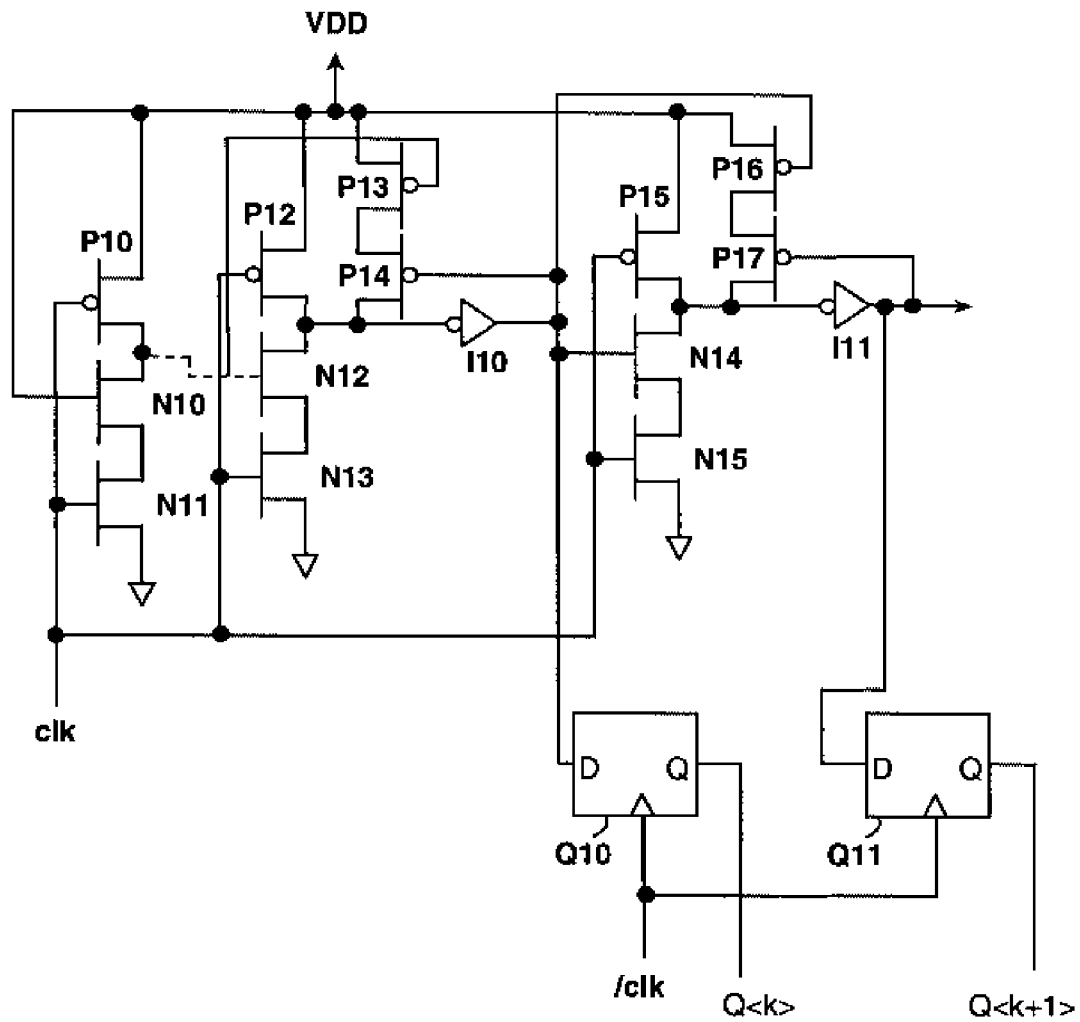
FIG. 3 is a schematic diagram depicting a measurement circuit according to yet another embodiment of the present invention.

Referring now to FIG. 3, a measurement circuit in accordance with yet another embodiment of the invention is shown. In the circuit of FIG. 3, the first dynamic logic stage is provided by transistors P10, N10 and N11 and the remaining dynamic logic stages (shown as cascaded with a dashed line to indicate that more stages may be inserted prior to the latched stages) have input-controlled keeper circuits provided by transistors P13,P16, which are controlled by the input states and transistors P14,P17 which is controlled by the output state. Transistors N12-N15, transistors P12,P15 and inverters I10-I11 provide the remainder of the dynamic logic stages, and latches Q10 and Q11 are provided to capture the output values. The circuit of FIG. 3 avoids keeper contention that can otherwise occurs when the logic stages evaluate, increasing the potential resolution of the measurement circuit by shortening the delay.

Figure 4:
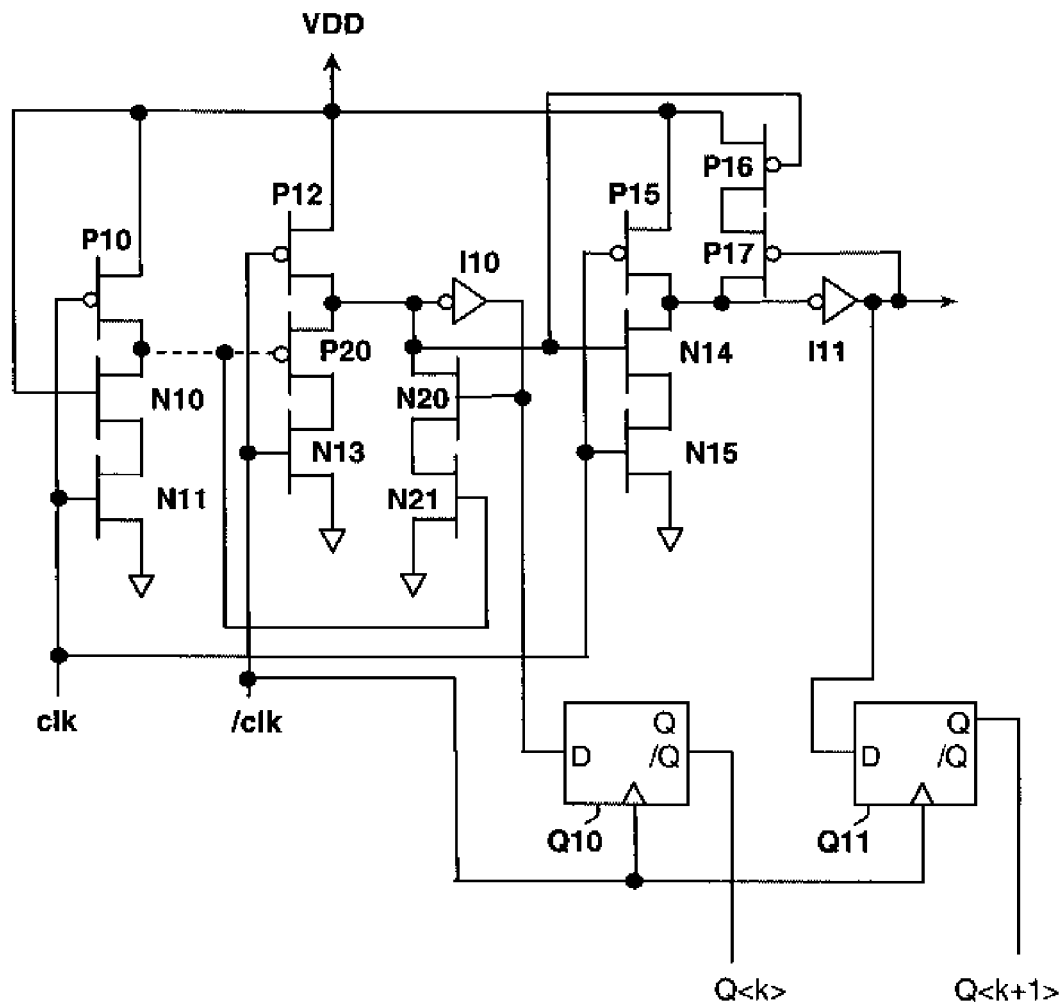
FIG. 4 is a schematic diagram depicting a measurement circuit according to still another embodiment of the present invention.

Referring now to FIG. 4, a measurement circuit in accordance with still another embodiment of the invention is shown. In the circuit of FIG. 4, the first and last dynamic logic stages illustrated are the same as those in FIG. 3, but even numbered stages have a low-side keeper circuit provided in the example, by transistors N20 and N21. Also, the even numbered stages evaluate to the positive power supply rail and are pre-charged to ground as provided by transistors P12, P20 and N13. Two clock phases, clock signal clk and inverter clock signal /clk, are used to clock alternative stages. The complementary output of even-numbered latches, e.g. Q10 are taken from the complementary output /Q, so that the output bit sequence still follows the form <0 . . . 01 . . . 1> for simple decoding or detection of the delay value. The measurement circuit of FIG. 4 is an "NP Zipper" circuit topology that increases the potential resolution of the measurement by shortening the delay of the stages. Since the evaluation signal path does not include the inverters the output of each stage, the signal causing evaluation through the stages propagates faster.

Figure 5:
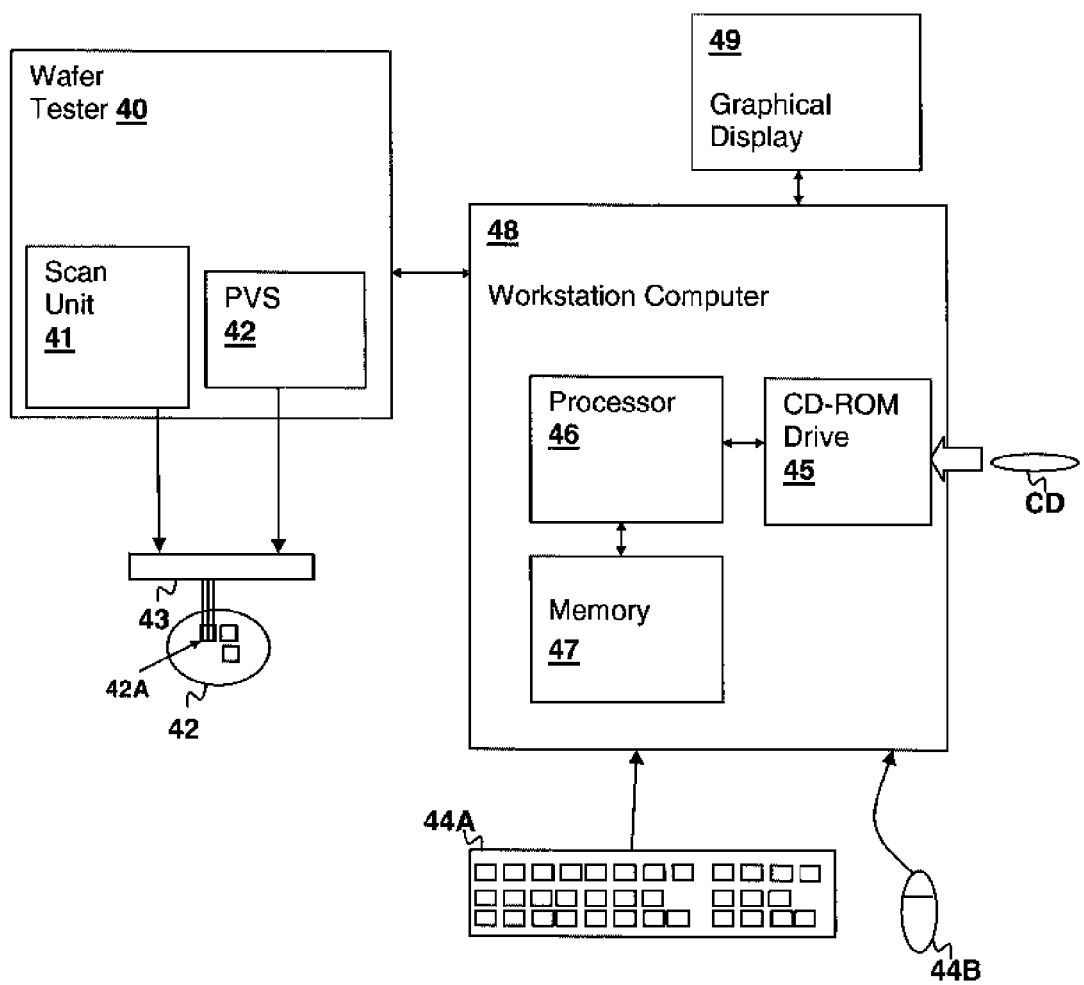
FIG. 5 is a block diagram of a wafer test system that may be used to perform circuit metric measurements in accordance with embodiments of the invention.

Referring now to FIG. 5, a wafer test system in which a method according to an embodiment of the invention is performed, is shown. A wafer tester 40 includes a scan unit 41 for providing stimulus to a die circuit 42A on a wafer under test 42, via a probe head 43 having electrical test connections to die circuit 42A. Wafer tester 40 also includes a programmable voltage supply (PVS) 42, which may be used to vary the supply voltage provided to the test circuits of the present invention and is coupled to die circuit 42A via probe head 43. PVS 42 may be used to perform calibrations of voltage supply delay sensitivity, and may also be varied for test purposes to evaluate the operation of the delay-based measurements.

A workstation computer 48, having a processor 46 coupled to a memory 47, for executing program instructions from memory 47, wherein the program instructions include program instructions for executing one or more methods in accordance with an embodiment of the present invention, is coupled to wafer tester 40, whereby the measurements described above are performed and measurements collected and stored in memory 47 and/or other media storage such as a hard disk. A CD-ROM drive 45 provides for import of program instructions in accordance with embodiments of the present invention that are stored on media such as compact disc CD. Workstation computer 48 is also coupled to a graphical display 49 for displaying program output such as the delay measurements and circuit metric values such as temperature and supply voltage computed from the delay measurements. Workstation computer 48 is further coupled to input devices such as a mouse 44B and a keyboard 44A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 48. Further, workstation computer 48 may be coupled to wafer tester 40 by such a network connection.

While the system of FIG. 5 depicts a configuration suitable for sequential test of a plurality of dies on a wafer, the depicted system is illustrative and not a limitation of the present invention. Probe head 43 may be a multi-die full wafer probe system, or may comprise multiple probe heads for simultaneously testing multiple wafers on a single or multiple die basis. Additionally, while scan control and reading of bit sequences indicating delay values, and/or computed circuit metrics is illustrated, the techniques of the present invention may also be applied to execution of measurement code from a processor incorporated on wafer 42 with appropriate interface to the outputs of the latches described above. The techniques may also apply to other types of digital interfaces that may be provided either by probe head 43, or an interface to a fully-packaged die. The resultant generated display or data exported from workstation computer 48 may take the form of graphical depictions of the circuit metrics across the die, such as supply voltage or other circuit metric topologies, or may other graphical or numerical information that describes the delays and/or circuit metrics and their variation across the circuit.

Figure 6:
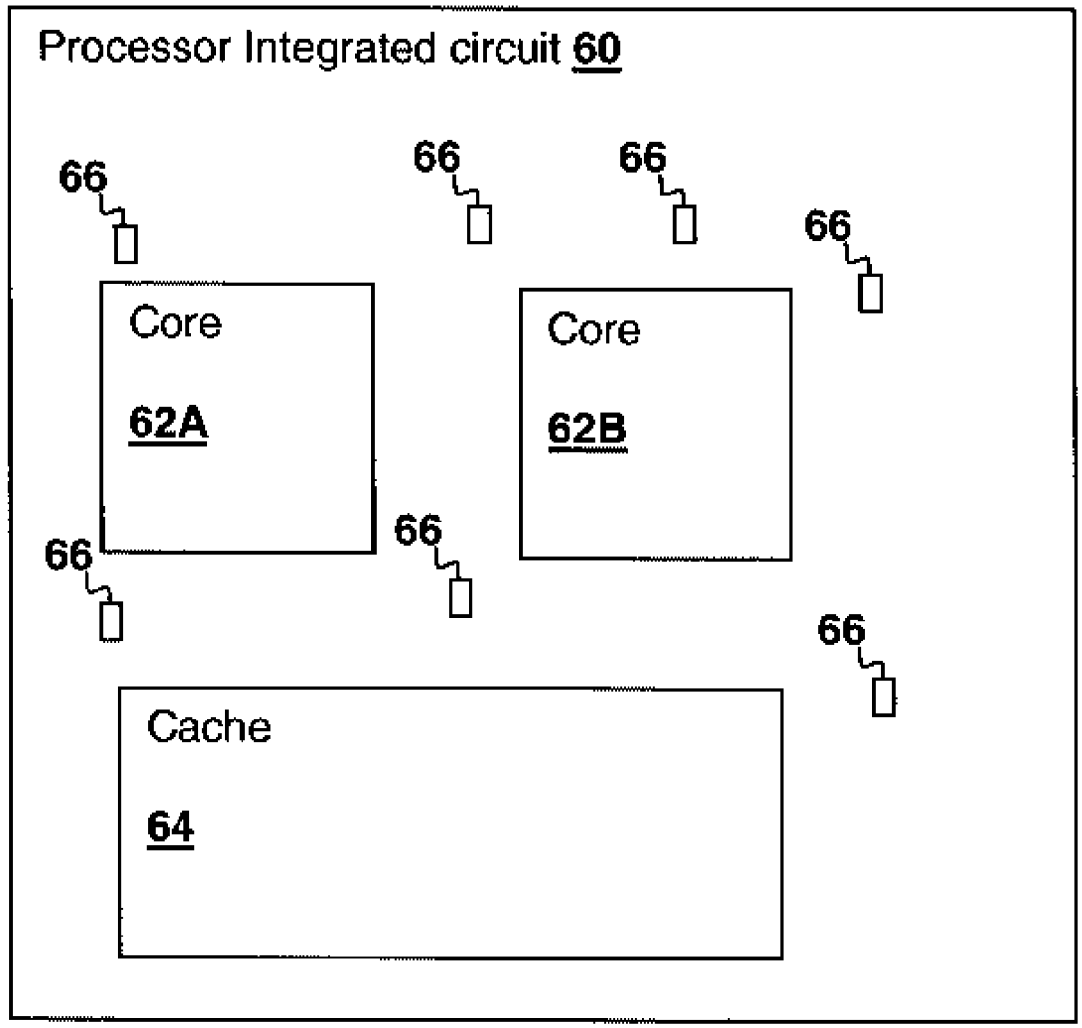
FIG. 6 is a pictorial diagram of a processor integrated circuit in accordance with an embodiment of the present invention.

Referring now to FIG. 6, a processor integrated circuit 60 in accordance with an embodiment of the present invention is shown. Processor integrated circuit is integrated on a single die and as illustrated, includes two processor cores 62 and a cache memory 64. Delay measurement circuits 66 are distributed around the die, so that local supply voltage, process and/or other metrics may be measured at particular points within the die. Delay measurement circuits 66 are coupled to one or both of processor cores 62 by a scan chain or other interface, so that the correction/simultaneous solution algorithms described above can be performed by one or both of processor cores 62 to obtain the circuit metric values. Delay measurement circuits 66 may be any of the circuits as illustrated in FIG. 1, FIGS. 2A-2B, FIG. 3 or FIG. 4.

Figure 7A:
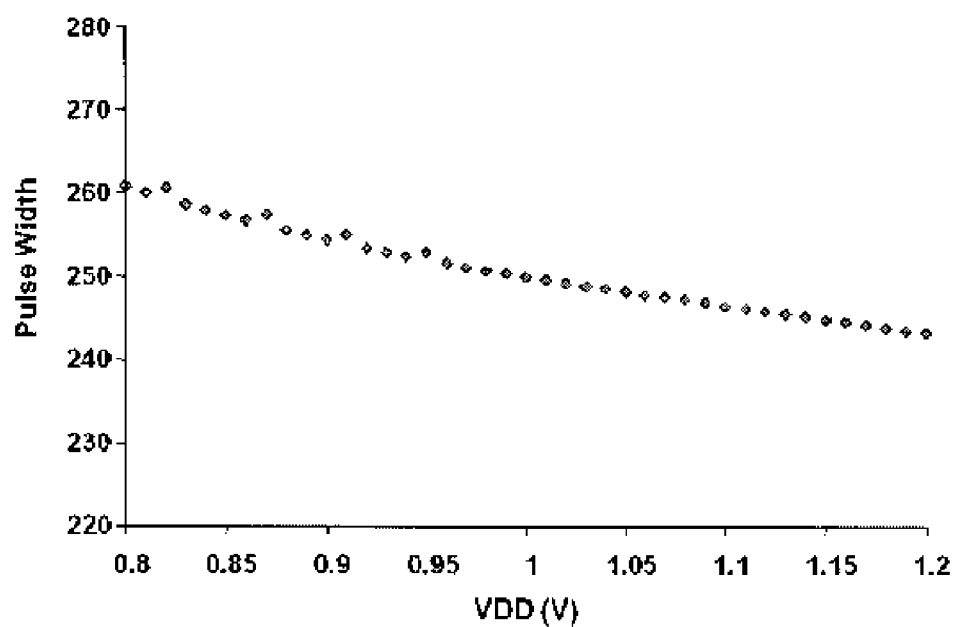
FIGS. 7A and 7B are graphs depicting reference pulse width versus voltage and delay versus voltage for a measurement circuit in accordance with an embodiment of the present invention.
Figure 7B:
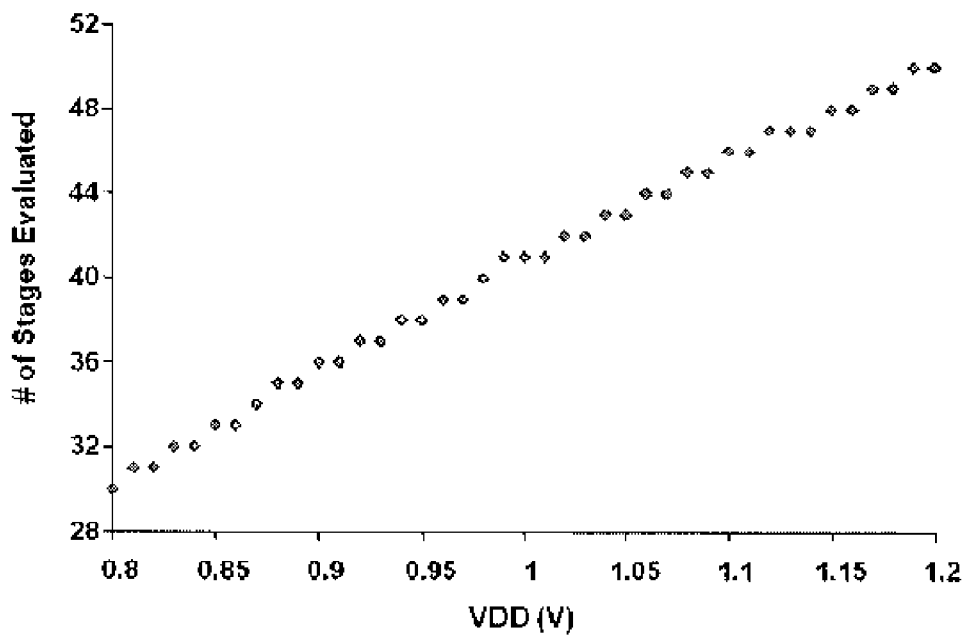

Referring now to FIG. 7A and FIG. 7B, behavior of delay circuits in accordance with embodiments of the invention are shown. FIG. 7A is a graph depicting the variation of pulse width with supply voltage for the circuit of FIG. 2B. As shown in the figure, the variation of pulse width over the full power supply voltage range is small. FIG. 7B shows the number of dynamic logic stages that are evaluated for a given supply voltage. While the variation of pulse width is less than 10% over the full range of voltages, 0.8V to 1.2V in FIG. 7A, in FIG. 7B the variation is approximately ⅔ of the minimum delay value at 1.2V (50 stages vs. 30 stages evaluated).

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for determining a value of a circuit metric under measurement within an integrated circuit, comprising:
   clocking a cascade of dynamic logic circuits having a delay sensitive to the value of the circuit metric under measurement with a pulse, wherein the active portion of the pulse commands the evaluate state of the dynamic logic circuits, and wherein a first one of the dynamic logic circuits has an input configured to cause an evaluation of the first one of the dynamic logic circuits when the pulse is active, wherein the cascade of dynamic logic circuits sequentially evaluates in response to the pulse; and
   subsequent to termination of the pulse, determining the value of the circuit metric under measurement from the position of a last one of the dynamic logic circuits that has evaluated during the pulse or the first one of the dynamic logic circuits that has not evaluated during the pulse.

2. The method of claim 1, further comprising generating the pulse from an edge of another signal, wherein the pulse is generated such that the width of the pulse is substantially independent of the circuit metric under measurement.

3. The method of claim 2, wherein the generating logically compares the edge of the other signal as delayed through a first signal path and a second signal path, wherein the first signal path and the second signal path are substantially identical other than a wire delay.

4. The method of claim 3, wherein the circuit metric under measurement is a power supply voltage provided to logic that substantially determines the delay of the first and second circuit path other than the wire delay.

5. The method of claim 1, further comprising latching the outputs of at least some of the dynamic logic circuits, and wherein the determining is performed in conformity with a result of the latching.

6. The method of claim 1, wherein the circuit metric under measurement is a power supply voltage provided to the cascade of dynamic logic circuits.

7. A circuit for measuring a value of a circuit metric within an integrated circuit, comprising:
   a plurality of dynamic logic circuits having a delay sensitive to the value of the circuit metric under measurement connected in cascade and clocked by a pulse signal, wherein the active portion of the pulse signal commands the evaluate state of the dynamic logic circuits, and wherein a first one of the dynamic logic circuits has an input configured to cause an evaluation of the first one of the dynamic logic circuits when the pulse is active, wherein the cascade of dynamic logic circuits sequentially evaluates in response to the pulse signal; and
   an output circuit for providing an indication of a number of the dynamic logic circuits that have evaluated or have not evaluated at termination of the pulse signal, whereby a value of the circuit metric under measurement is indicated by the indication.

8. The circuit of claim 7, further comprising a pulse generator for receiving an input signal and generating the pulse signal in response to an edge of the input signal, wherein a width of the pulse signal is substantially constant with respect to variation of the circuit metric under measurement.

9. The circuit of claim 8, wherein the pulse generator comprises:
an input for receiving the input signal;
a first circuit path having an input connected to the input signal;
a second circuit path having an input connected to the input signal, wherein a delay of the second circuit path is substantially equal to a delay of the first circuit path except for a wire delay provided in the second circuit path; and
an exclusive-OR gate having a first input connected to an output of the first circuit path and a second input connected to an output of the second circuit path, wherein the output of the exclusive-OR gate provides the pulse signal.

10. The circuit of claim 9, wherein the circuit metric under measurement is a power supply voltage provided to logic that substantially determines the delay of the first and second circuit path other than the wire delay.

11. The circuit of claim 8, wherein the output circuit comprises a plurality of latches, each having an input coupled to an output of a corresponding one of the dynamic logic circuits, and wherein a clock input of each of the plurality of latches is coupled to an output of the pulse generator.

12. The circuit of claim 7, wherein the output circuit is a latch for latching the outputs of at least some of the dynamic logic circuits, and wherein a clock input of the latch is provided by a trailing edge of the pulse signal.

13. The circuit of claim 7, wherein the circuit metric under measurement is a power supply voltage provided to the plurality of dynamic logic circuits.

14. A processor, comprising:
a plurality of functional logic blocks for executing program instructions; and
a circuit metric measurement circuit comprising a plurality of dynamic logic circuits having a delay sensitive to the value of the circuit metric under measurement connected in cascade and clocked by a pulse signal, wherein the active portion of the pulse signal commands the evaluate state of the dynamic logic circuits, and wherein a first one of the dynamic logic circuits has an input configured to cause an evaluation of the first one of the dynamic logic circuits when the pulse is active, wherein the cascade of dynamic logic circuits sequentially evaluates in response to the pulse signal, and an output circuit for providing an indication of a number of the dynamic logic circuits that have evaluated or have not evaluated at termination of the pulse signal, whereby a value of the circuit metric under measurement is indicated by the indication.

15. The processor of claim 14, wherein the circuit metric measurement circuit further comprises a pulse generator for receiving an input signal and generating the pulse signal in response to an edge of the input signal, wherein a width of the pulse signal is substantially constant with respect to variation of the circuit metric under measurement.

16. The processor of claim 15, wherein the pulse generator comprises:
an input for receiving the input signal;
a first circuit path having an input connected to the input signal;
a second circuit path having an input connected to the input signal, wherein a delay of the second circuit path is substantially equal to a delay of the first circuit path except for a wire delay provided in the second circuit path; and
an exclusive-OR gate having a first input connected to an output of the first circuit path and a second input connected to an output of the second circuit path, wherein the output of the exclusive-OR gate provides the pulse signal.

17. The processor of claim 16, wherein the circuit metric under measurement is a power supply voltage provided to logic that substantially determines the delay of the first and second circuit path other than the wire delay.

18. The processor of claim 15, wherein the output circuit comprises a plurality of latches, each having an input coupled to an output of a corresponding one of the dynamic logic circuits, and wherein a clock input of each of the plurality of latches is coupled to an output of the pulse generator.

19. The processor of claim 14, wherein the output circuit is a latch for latching the outputs of at least some of the dynamic logic circuits, and wherein a clock input of the latch is provided by a trailing edge of the pulse signal.

20. The processor of claim 14, wherein the circuit metric under measurement is a power supply voltage provided to the plurality of dynamic logic circuits.

21. A circuit for measuring a value of a circuit metric within an integrated circuit, comprising:
a pulse generator having an input for receiving an input signal, a first circuit path having an input connected to the input signal, and second circuit path having an input connected to the input signal, wherein a delay of the second circuit path is substantially equal to a delay of the first circuit path except for a wire delay provided in the second circuit path, and logic for comparing an output of the first circuit path and an output of the second circuit path to generate a pulse signal; and
a plurality of delay stages having a delay sensitive to the value of the circuit metric under measurement connected in cascade and enabled by the pulse signal, wherein the plurality of delay stages propagates a state change during assertion of the pulse signal; and
an output circuit for providing an indication of a number of the delay states that have received the state change at termination of the pulse signal, whereby a value of the circuit metric under measurement is indicated by the indication.

22. The circuit of claim 21, wherein the pulse generator comprises an exclusive-OR gate having a first input connected to an output of the first circuit path and a second input connected to an output of the second circuit path, wherein the output of the exclusive-OR gate provides the pulse signal, and wherein the first circuit path is identical to the second circuit path except for inclusion of a wire length in the second circuit path.

23. The circuit of claim 21, wherein the output circuit comprises a plurality of latches, each having an input coupled to an output of a corresponding one of the dynamic logic circuits, and wherein a clock input of each of the plurality of latches is coupled to an output of the pulse generator.

24. A circuit for measuring a value of a circuit metric within an integrated circuit, comprising:
a pulse generator for receiving an input signal and generating a pulse signal in response to an edge of the input signal, wherein a width of the pulse signal is substantially constant with respect to variation of the circuit metric under measurement, wherein the pulse generator comprises an input for receiving the input signal, a first circuit path having an input connected to the input signal, a second circuit path having an input connected to the input signal, wherein a delay of the second circuit path is substantially equal to a delay of the first circuit path except for a wire delay provided in the second circuit path, and an exclusive-OR gate having a first input connected to an output of the first circuit path and a second input connected to an output of the second circuit path, wherein the output of the exclusive-OR gate provides the pulse signal;

a plurality of dynamic logic circuits having a delay sensitive to the value of the circuit metric under measurement connected in cascade and clocked by the pulse signal, wherein the active portion of the pulse signal commands the evaluate state of the dynamic logic circuits, and wherein a first one of the dynamic logic circuits has an input configured to cause an evaluation of the first one of the dynamic logic circuits when the pulse is active, wherein the cascade of dynamic logic circuits sequentially evaluates in response to the pulse signal; and an output circuit comprising a plurality of latches, each having an input coupled to an output of a corresponding one of the dynamic logic circuits, and wherein a clock input of each of the plurality of latches is coupled to an output of the pulse generator.

* * * * *